United States Patent
Suzuki et al.

(10) Patent No.: US 9,849,791 B2
(45) Date of Patent: Dec. 26, 2017

(54) VEHICLE DRIVE DEVICE

(71) Applicant: AISIN AW CO., LTD., Anjo-shi, Aichi-ken (JP)

(72) Inventors: Tomoyuki Suzuki, Anjo (JP); Tatsuyuki Uechi, Anjo (JP); Tatsuya Kondo, Anjo (JP); Yoshinobu Ito, Anjo (JP)

(73) Assignee: AISIN AW CO., LTD., Anjo (JP)

( * ) Notice: Subject to any disclaimer, the term of this patent is extended or adjusted under 35 U.S.C. 154(b) by 0 days.

(21) Appl. No.: 14/780,335

(22) PCT Filed: Mar. 18, 2014

(86) PCT No.: PCT/JP2014/057307
§ 371 (c)(1),
(2) Date: Sep. 25, 2015

(87) PCT Pub. No.: WO2014/192377
PCT Pub. Date: Dec. 4, 2014

(65) Prior Publication Data
US 2016/0185232 A1    Jun. 30, 2016

(30) Foreign Application Priority Data

May 31, 2013  (JP) .................................. 2013-116027
Jun. 28, 2013  (JP) .................................. 2013-136968

(51) Int. Cl.
*H02K 11/00*  (2016.01)
*H02P 27/06*  (2006.01)
(Continued)

(52) U.S. Cl.
CPC ................ *B60L 11/04* (2013.01); *B60K 6/26* (2013.01); *B60K 6/405* (2013.01); *B60K 6/48* (2013.01);
(Continued)

(58) Field of Classification Search
CPC ......... B60L 11/04; B60K 31/06; H02K 11/00; H02P 27/06
(Continued)

(56) References Cited

U.S. PATENT DOCUMENTS 4,087,728 A * 5/1978 Porter ................... F16K 31/046
318/466
6,078,155 A * 6/2000 Tominaga ............ H05K 7/1432
318/293
(Continued)

FOREIGN PATENT DOCUMENTS

DE       19929594 A1    1/2000
EP        1000790 A2    5/2000
(Continued)

OTHER PUBLICATIONS

U.S. Appl. No. 14/780,130, filed Sep. 25, 2015 in the name of Takahashi et al.
(Continued)

*Primary Examiner* — Kawing Chan
(74) *Attorney, Agent, or Firm* — Oliff PLC

(57) ABSTRACT

A vehicle drive device that includes a rotary electric machine that serves as a drive force source for wheels; a speed change mechanism; a pump motor that serves as a drive force source for an electric pump that generates a hydraulic pressure to be supplied to a servo mechanism for the speed change mechanism; a case that accommodates the speed change mechanism; and a first inverter that controls the rotary electric machine and a second inverter that controls the pump motor, the first inverter and the second inverter being connected to a common DC power source, wherein: the first inverter and the second inverter are disposed in the case; and a first wiring member that extends from the DC power source is branched in the case to be
(Continued)

connected to each of the first inverter and the second inverter.

10 Claims, 9 Drawing Sheets

(51) Int. Cl.
| | | |
|---|---|---|
| B60L 11/04 | (2006.01) | |
| B60K 6/405 | (2007.10) | |
| B60K 6/48 | (2007.10) | |
| B60L 11/14 | (2006.01) | |
| B60L 1/00 | (2006.01) | |
| B60L 15/00 | (2006.01) | |
| H05K 7/14 | (2006.01) | |
| B60K 6/26 | (2007.10) | |
| B60K 31/06 | (2006.01) | |
| F16H 61/00 | (2006.01) | |

(52) U.S. Cl.
CPC .............. *B60K 31/06* (2013.01); *B60L 1/003* (2013.01); *B60L 11/14* (2013.01); *B60L 15/007* (2013.01); *F16H 61/0031* (2013.01); *H02K 11/0094* (2013.01); *H02P 27/06* (2013.01); *H05K 7/1432* (2013.01); *B60L 2210/40* (2013.01); *B60Y 2400/61* (2013.01); *Y02T 10/6221* (2013.01); *Y02T 10/645* (2013.01); *Y02T 10/70* (2013.01); *Y02T 10/7077* (2013.01); *Y02T 10/7241* (2013.01)

(58) Field of Classification Search
USPC .......................................................... 318/34
See application file for complete search history.

(56) References Cited

U.S. PATENT DOCUMENTS

| | | | |
|---|---|---|---|
| 6,118,237 A | 9/2000 | Kikuchi et al. | |
| 6,166,498 A | 12/2000 | Yamaguchi et al. | |
| 2001/0024997 A1* | 9/2001 | Sugano | B60K 6/543 477/2 |
| 2002/0060099 A1 | 5/2002 | Takenaka et al. | |
| 2004/0028531 A1* | 2/2004 | Morikawa | B62D 5/0406 417/44.11 |
| 2004/0226761 A1 | 11/2004 | Takenaka et al. | |
| 2005/0011689 A1* | 1/2005 | Tajima | B60K 6/40 180/65.26 |
| 2009/0023529 A1* | 1/2009 | Sanji | B60K 6/365 475/5 |
| 2009/0054190 A1 | 2/2009 | Kim et al. | |
| 2009/0071784 A1 | 3/2009 | Combs et al. | |
| 2009/0100965 A1 | 4/2009 | Sanji et al. | |
| 2009/0206709 A1 | 8/2009 | Kakuda et al. | |
| 2009/0224706 A1* | 9/2009 | Jobard | B60L 3/0076 318/380 |
| 2010/0084206 A1 | 4/2010 | Yoshida et al. | |
| 2010/0127586 A1 | 5/2010 | Yoshida et al. | |
| 2011/0285335 A1* | 11/2011 | Tada | H02H 7/0844 318/400.22 |
| 2012/0090425 A1* | 4/2012 | Kasuya | B60K 6/387 74/661 |
| 2012/0242198 A1* | 9/2012 | Kasuya | H02K 7/083 310/68 B |
| 2012/0248909 A1 | 10/2012 | Ito et al. | |
| 2012/0300522 A1 | 11/2012 | Tokuyama et al. | |
| 2014/0084719 A1 | 3/2014 | Asakura et al. | |
| 2016/0039276 A1 | 2/2016 | Takahashi et al. | |
| 2016/0052380 A1 | 2/2016 | Miyazawa et al. | |
| 2016/0072361 A1 | 3/2016 | Kuramochi et al. | |

FOREIGN PATENT DOCUMENTS

| | | |
|---|---|---|
| EP | 2487711 A1 | 8/2012 |
| JP | 2000-023307 A | 1/2000 |
| JP | 2000-217205 A | 8/2000 |
| JP | 2001-119898 A | 4/2001 |
| JP | 2001-187535 A | 7/2001 |
| JP | 2001-322439 A | 11/2001 |
| JP | 2002-120575 A | 4/2002 |
| JP | 2004-153897 A | 5/2004 |
| JP | 2004-215348 A | 7/2004 |
| JP | 2004-222354 A | 8/2004 |
| JP | 2004-343845 A | 12/2004 |
| JP | 2007-166803 A | 6/2007 |
| JP | 2008-290621 A | 12/2008 |
| JP | 2008-301572 A | 12/2008 |
| JP | 2009-101730 A | 5/2009 |
| JP | 2009-201218 A | 9/2009 |
| JP | 2011-067093 A | 3/2011 |
| JP | 2011-213230 A | 10/2011 |
| JP | 2012-065436 A | 3/2012 |
| JP | 2012-121549 A | 6/2012 |
| JP | 2012-162132 A | 8/2012 |
| JP | 2012-217263 A | 11/2012 |
| KR | 2009-0020791 A | 2/2009 |
| WO | 2009-104491 A1 | 8/2009 |
| WO | 2011110253 A1 | 9/2011 |
| WO | 2012107826 A1 | 8/2012 |
| WO | 2014/192376 A1 | 12/2014 |

OTHER PUBLICATIONS

U.S. Appl. No. 14/780,155, filed Sep. 25, 2015 in the name of Kuramochi et al.
U.S. Appl. No. 14/780,135, filed Sep. 25, 2015 in the name of Miyazawa et al.
Mar. 7, 2017 Search Report issued in European Patent Application No. 14804473.8.

* cited by examiner

VEHICLE DRIVE DEVICE

BACKGROUND

The present disclosure relates to a vehicle drive device that includes a rotary electric machine that serves as a drive force source for wheels, a speed change mechanism, a pump motor that serves as a drive force source for an electric pump, and a case.

A device described in Japanese Patent Application Publication No. 2012-121549 and a device described in Japanese Patent Application Publication No. 2011-67093 are known as examples of the vehicle drive device described above. In the device according to Japanese Patent Application Publication No. 2012-121549, a first inverter [inverter 440] that controls a rotary electric machine [motor 200] and a second inverter [oil pump controller 420] that controls a pump motor [electric oil pump 400] are connected to different electric power sources. The first inverter is connected to a high-voltage battery [main battery 450] for driving the vehicle, and the second inverter is connected to a low-voltage battery [auxiliary battery 430] for driving auxiliaries. In such a configuration, however, wiring between the electric power source and the inverter and between the inverter and the rotary electric machine or the pump motor is required for each of the rotary electric machine and the pump motor. Hence, wiring in the entire device is complicated.

In this respect, in the device according to Japanese Patent Application Publication No. 2011-67093, a first inverter [inverter device 140] that controls a rotary electric machine [motor generator 192] and a second inverter [auxiliary inverter device 43] that controls a pump motor [auxiliary motor 195] are driven by a common electric power source [battery 136]. This allows wiring between the common electric power source and the inverters to be partially commonalized, which relieves complication of the wiring more or less. In the device according to Japanese Patent Application Publication No. 2011-67093, however, the first inverter and the second inverter are accommodated in a dedicated inverter case [housing for an electric power conversion device 200] together with a smoothing capacitor [capacitor module 500]. The inverter case is fixed to a drive device case that accommodates the rotary electric machine and a speed change mechanism [transmission 118]. Therefore, it is necessary to prepare such a dedicated inverter case and a fixation seat for fixation of the inverter case to the drive device case, which increases the number of parts. In addition, the size of the entire device is also increased.

SUMMARY

In view of the foregoing, it is desirable to simplify wiring and downsize the entire vehicle at the same time.

The present disclosure according to an exemplary aspect provides a vehicle drive device including: a rotary electric machine that serves as a drive force source for wheels; a speed change mechanism; a pump motor that serves as a drive force source for an electric pump that generates a hydraulic pressure to be supplied to a servo mechanism for the speed change mechanism; a case that accommodates the speed change mechanism; and a first inverter that controls the rotary electric machine and a second inverter that controls the pump motor, the first inverter and the second inverter being connected to a common DC power source, in which: the first inverter and the second inverter are disposed in the case; and a first wiring member that extends from the DC power source is branched in the case to be connected to each of the first inverter and the second inverter.

The term "rotary electric machine" as used herein refers to any of a motor (electric motor), a generator (electric generator), and a motor generator that functions both as a motor and as a generator as necessary.

According to the characteristic configuration, the first inverter which controls the rotary electric machine and the second inverter which controls the pump motor are connected to the common DC power source. Thus, wiring can be simplified compared to a case where the first inverter and the second inverter include individual DC power sources. In addition, the first inverter and the second inverter are disposed in the case which accommodates the speed change mechanism directly not via a dedicated inverter case. Thus, the entire device can be downsized while reducing the number of parts. Further, the first wiring member which extends from the DC power source is branched in the case to be connected to the two inverters. Thus, there is only one connection portion between the inside and the outside of the case. Hence, wiring from the DC power source to the vehicle drive device can be simplified also in this respect.

Preferable aspects of the present disclosure will be described below.

In one aspect, preferably, the first inverter and the second inverter are disposed in a control element accommodation chamber formed in the case; and the first wiring member is branched in the control element accommodation chamber to be connected to each of the first inverter and the second inverter.

According to the configuration, the first inverter and the second inverter which control the rotary electric machine and the electric pump, respectively, are accommodated in the common control element accommodation chamber. Hence, it is easy to dispose the two inverters compactly, and to branch the first wiring member to be connected to each of the two inverters.

In one aspect, preferably, the rotary electric machine and the pump motor are accommodated in a drive element accommodation chamber formed in the case in an oil-tight manner; the drive element accommodation chamber and the control element accommodation chamber communicate with each other via a communication hole; and both a second wiring member that connects between the first inverter and the rotary electric machine and a third wiring member that connects between the second inverter and the pump motor pass through the communication hole.

According to the configuration, the first inverter and the second inverter, which are accommodated in the control element accommodation chamber, and the rotary electric machine and the pump motor, which are accommodated in the drive element accommodation chamber, can be appropriately electrically connected to each other via the single communication hole. In this event, entry of oil into the control element accommodation chamber can be effectively suppressed by just sealing the periphery of the single communication hole. Hence, the structure can be simplified while securing oil-tightness.

In one aspect, preferably, the second wiring member includes a relay terminal disposed in the communication hole and a plurality of bus bars that connect between the first inverter and the relay terminal; and the plurality of bus bars and a substrate that constitutes the second inverter are integrally held by a holding member.

According to the configuration, the plurality of bus bars, which compose a part of the second wiring member which connects between the first inverter and the rotary electric machine, and the substrate, which constitutes the second inverter, can be integrated with each other to make such components compact. In addition, work of assembling such parts during manufacture can be simplified.

In one aspect, preferably, in a vehicle mounted state, the communication hole is disposed above a surface of oil in the drive element accommodation chamber.

According to the configuration, oil stored in the drive element accommodation chamber can be prevented from reaching the communication hole. In particular, oil can be prevented from reaching the communication hole even in the case where the surface of oil in the drive element accommodation chamber fluctuates during travel of the vehicle. Hence, entry of oil into the control element accommodation chamber can be effectively prevented.

In one aspect, preferably, the vehicle drive device further includes a smoothing capacitor connected between the DC power source and the first inverter and the second inverter to smooth DC power to be supplied to both the first inverter and the second inverter; and the smoothing capacitor and the first inverter are disposed side by side, and the first inverter and the second inverter are disposed side by side.

According to the configuration, fluctuations in DC power exchanged between the DC power source and the first inverter and the second inverter can be suppressed. Hence, the rotary electric machine and the pump motor can be stably driven, and degradation of the DC power source can be suppressed. In addition, the first inverter, through which a high current often flows compared to the second inverter, can be disposed close to the smoothing capacitor, which reduces the impedance as a whole.

In one aspect, preferably, the case includes a first case portion that accommodates the speed change mechanism and a second case portion that accommodates the rotary electric machine; and the electric pump and the pump motor are disposed in the first case portion, and a control element accommodation chamber that accommodates at least one of the first inverter and the second inverter is formed along an outer peripheral wall of the first case portion.

According to the configuration, it is easy to dispose the electric pump and the speed change mechanism (servo mechanism), to which oil is supplied from the electric pump, close to each other. Hence, the configuration of an oil passage from the electric pump and the servo mechanism can be simplified. In addition, entry of oil into the control element accommodation chamber can be effectively suppressed by forming the control element accommodation chamber along and on the outer side of the outer peripheral wall of the first case portion.

DETAILED DESCRIPTION OF THE EMBODIMENTS

A vehicle drive device according to an embodiment of the present disclosure will be described with reference to the drawings. A vehicle drive device 1 according to the embodiment is a vehicle drive device (hybrid vehicle drive device) configured to drive a vehicle (hybrid vehicle) that includes both an internal combustion engine E and a rotary electric machine MG as drive force sources for wheels W. Specifically, the vehicle drive device 1 is constituted as a drive device for a one-motor parallel type hybrid vehicle. In the following description, terms related to the direction, the position, etc. of each member may allow a difference due to a manufacturing error. In addition, directions for each member indicate directions with that member assembled to the vehicle drive device 1.

1. Schematic Configuration of Vehicle Drive Device

Figure 1:
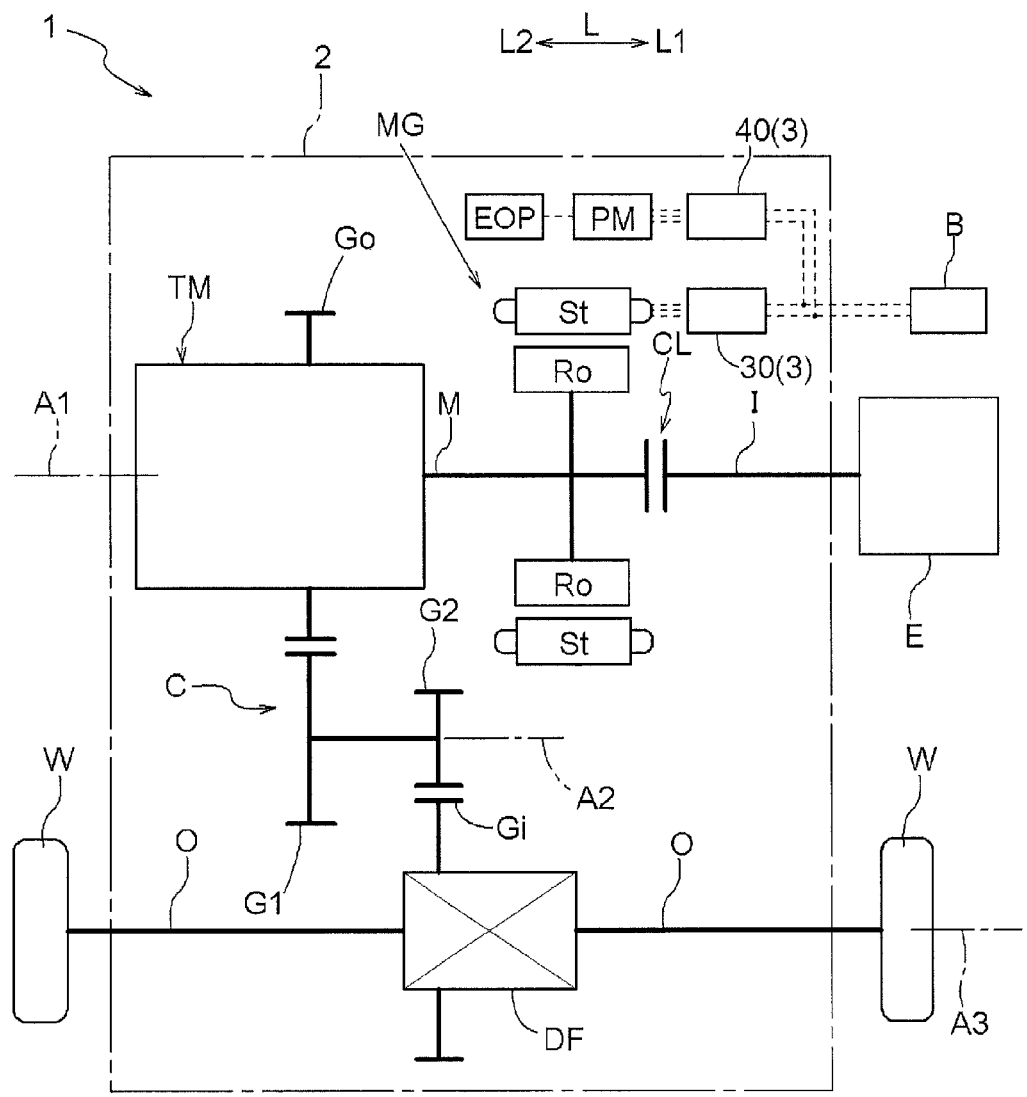
FIG. 1 is a schematic diagram illustrating a schematic configuration of a vehicle drive device.

As illustrated in FIG. 1, the vehicle drive device 1 includes an input shaft I that serves as an input member drivably coupled to the internal combustion engine E, output shafts O that serve as an output member drivably coupled to the wheels W, the rotary electric machine MG, and a speed change mechanism TM. In the embodiment, in addition, the vehicle drive device 1 also includes an engagement device CL, a gear mechanism C, and a differential gear device DF. The engagement device CL, the rotary electric machine MG, the speed change mechanism TM, the gear mechanism C, and the differential gear device DF are provided in a power transfer path that connects between the input shaft I and the output shafts O. Such components are provided in the order in which they are mentioned from the side of the input shaft I. In addition, such components are accommodated in a case (drive device case) 2.

The term "drivably coupled" means a state in which two rotary elements are coupled to each other in such a manner that enables transfer of a drive force (a synonym for torque). The concept includes a state in which the two rotary elements are coupled so as to rotate together with each other, and a state in which the two rotary elements are coupled via one or more transmission members in such a manner that enables transfer of a drive force. Such transmission members may include various members that transfer rotation at an equal speed or a changed speed (such as a shaft, a gear mechanism, and a belt), and include engagement devices that selectively transfer rotation and a drive force (such as a friction engagement device and a meshing-type engagement device).

The input shaft I, the rotary electric machine MG, and the speed change mechanism TM are disposed on a first axis A1. That is, the input shaft I, the rotary electric machine MG, and the speed change mechanism TM are disposed side by side along the direction of extension of the first axis A1 with the first axis A1, which is an imaginary axis, as the rotational axis (also see FIG. 9). In addition, the gear mechanism C is disposed on a second axis A2. That is, the gear mechanism C is disposed along the direction of extension of the second axis A2 with the second axis A2, which is an imaginary axis, as the rotational axis. In addition, the differential gear device DF is disposed on a third axis A3. That is, the differential gear device DF is disposed along the direction of extension of the third axis A3 with the third axis A3, which is an imaginary axis, as the rotational axis. The three axes A1, A2, and A3 are disposed in parallel with each other. In the embodiment, the direction that is parallel to the three axes A1, A2, and A3 is defined as an "axial direction L". In addition, the direction in the axial direction L from the speed change mechanism TM side toward the input shaft I side (rightward in FIG. 1) is defined as a "first axial direction L1", and the direction in the axial direction L from the input shaft I side toward the speed change mechanism TM side (leftward in FIG. 1) is defined as a "second axial direction L2".

Figure 3:
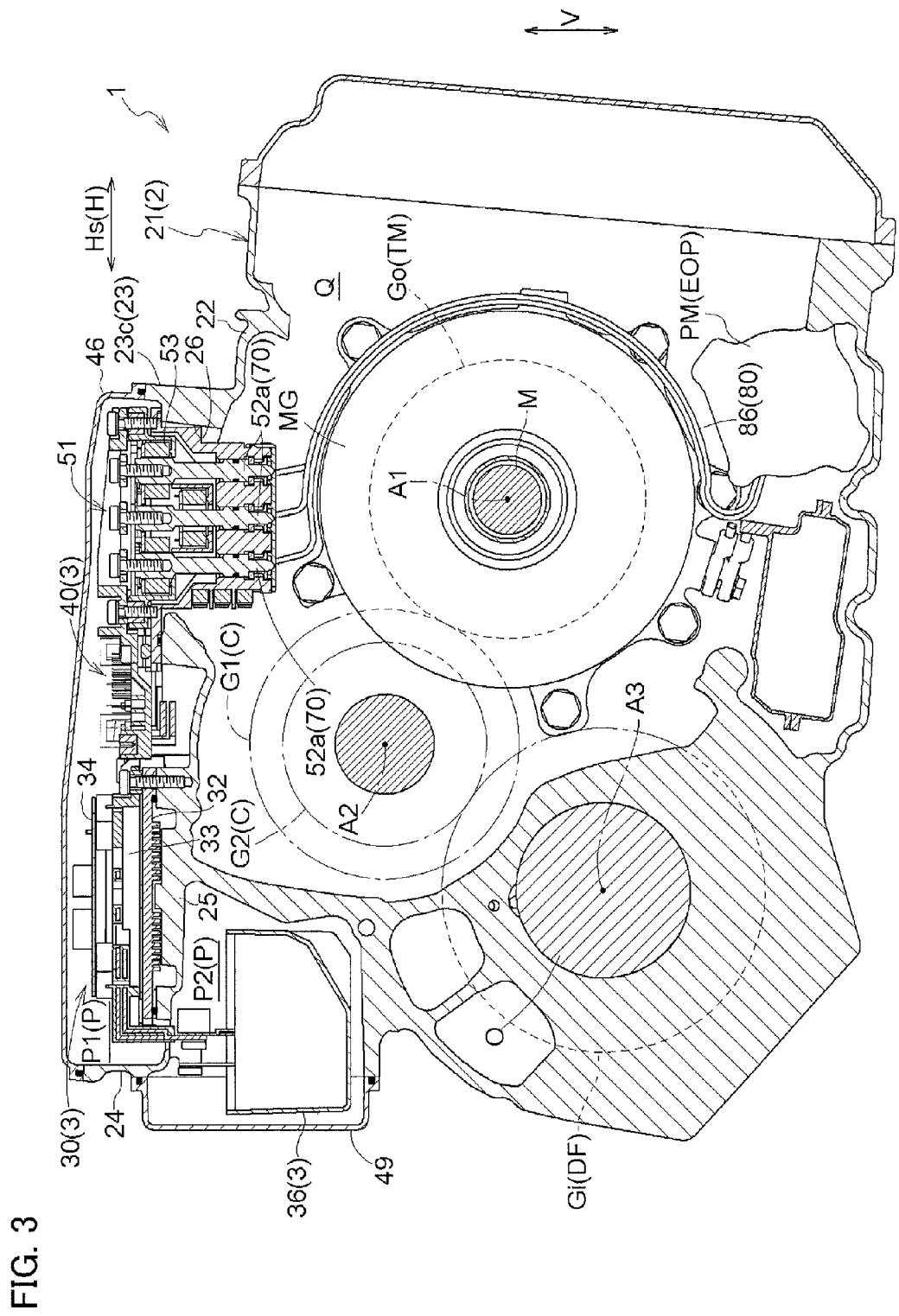
FIG. 3 illustrates the vehicle drive device as seen in the axial direction.

As illustrated in FIG. 3, the first axis A1, the second axis A2, and the third axis A3, which are separate axes, are disposed at different positions as seen in the axial direction L. In the embodiment, the first axis A1, the second axis A2, and the third axis A3 are disposed so as to be positioned at the vertexes of a triangle (in the example, an obtuse triangle) as seen in the axial direction L. In other words, the first axis A1, the second axis A2, and the third axis A3 are disposed such that imaginary lines that connect between the axes as seen in the axial direction L form a triangle. In the embodiment, in addition, in a vehicle mounted state (a state in which the vehicle drive device 1 is mounted on a vehicle) illustrated in FIG. 3, the second axis A2 is disposed above (on the upper side in a vertical direction V with respect to) the first axis A1 and the third axis A3. Such a vehicle drive device 1 with a multi-axis configuration is suitable to be mounted on Front Engine Front Drive (FF) vehicles, for example.

As illustrated in FIG. 1, the input shaft (drive device input shaft) I is drivably coupled to the internal combustion engine E. The internal combustion engine E is a motor (such as a gasoline engine or a diesel engine) driven by combusting fuel inside the engine to take out power. In the embodiment, the input member I is drivably coupled to an output shaft (such as a crankshaft) of the internal combustion engine E. The output shaft of the internal combustion engine E and the input shaft I may be drivably coupled to each other via a damper or the like.

The engagement device CL is provided in a power transfer path that connects between the input shaft I and the rotary electric machine MG. The engagement device CL selectively drivably couples the input shaft I (internal combustion engine E) and the rotary electric machine MG to each other. The engagement device CL functions as an internal combustion engine-disengaging engagement device that disengages the internal combustion engine E from the wheels W. In the embodiment, the engagement device CL is constituted as a hydraulically driven friction engagement device. The engagement device CL may be an electromagnetically driven friction engagement device, a meshing-type engagement device, or the like.

The rotary electric machine MG includes a stator St fixed to the case 2 and a rotor Ro supported on the radially inner side of the stator St so as to be freely rotatable. The rotary electric machine MG can function as a motor (electric motor) that is supplied with electric power to generate power and as a generator (electric generator) that is supplied with power to generate electric power. The rotary electric machine MG is electrically connected to an electricity accumulation device B (such as a battery or a capacitor) via a first inverter 30. The rotary electric machine MG is supplied with electric power from the electricity accumulation device B to perform power running, or supplies electric power generated using torque of the internal combustion engine E or an inertial force of the vehicle to the electricity accumulation device B to accumulate the electric power. The rotor Ro of the rotary electric machine MG is drivably coupled to an intermediate shaft M so as to rotate together with the intermediate shaft M. The intermediate shaft M serves as an input shaft of the speed change mechanism TM (transmission input shaft).

In the embodiment, the speed change mechanism TM is a stepped automatic transmission that includes a plurality of gear mechanisms and a plurality of shifting engagement devices to switchably provide a plurality of shift speeds with different speed ratios. An automatic continuously variable transmission with continuously variable speed ratios, a stepped manual transmission that switchably provides a plurality of shift speeds with different speed ratios, a fixed transmission that provides a single shift speed with a fixed speed ratio, or the like may also be used as the speed change mechanism TM. The speed change mechanism TM transfers rotation and torque input to the intermediate shaft M to a transmission output gear Go of the speed change mechanism TM with the speed changed at a speed ratio at each timing and with torque converted.

The transmission output gear Go is drivably coupled to the gear mechanism (counter gear mechanism) C. The gear mechanism C includes a first gear G1 and a second gear G2 each formed on a common shaft member. The first gear G1 meshes with the transmission output gear Go of the speed change mechanism TM. The second gear G2 meshes with a differential input gear Gi of the differential gear device DF. In the embodiment, the second gear G2 is disposed on the side in the first axial direction L1 (internal combustion engine E side) with respect to the first gear G1. The second gear G2 is formed to be smaller in diameter (have less teeth) than the first gear G1.

The differential gear device (output differential gear device) DF is drivably coupled to the wheels W via the output shafts O. The differential gear device DF includes the differential input gear Gi and a differential body portion (a body portion of the differential gear device DF) coupled to the differential input gear Gi. The differential body portion is configured to include a plurality of bevel gears that mesh with each other, and a differential case that accommodates the plurality of bevel gears, and plays a central role in a differential mechanism. The differential gear device DF distributes and transfers rotation and torque input from the rotary electric machine MG side to the differential input gear Gi via the speed change mechanism TM and the gear mechanism C to the two, left and right, output shafts O (that is, the two, left and right, wheels W) through the differential body portion. This allows the vehicle drive device 1 to transfer torque of at least one of the internal combustion engine E and the rotary electric machine MG to the wheels W to drive the vehicle.

The vehicle drive device 1 includes a mechanical pump (not illustrated) drivably coupled to the intermediate shaft M so as to rotate together with the intermediate shaft M. The mechanical pump discharges oil using torque of at least one of the internal combustion engine E and the rotary electric machine MG with at least one of the internal combustion engine E and the rotary electric machine MG rotating. In the embodiment, in addition, the vehicle drive device 1 also includes an electric pump EOP driven by a pump motor PM (also see FIG. 3) provided independently of the power transfer path which connects between the input shaft I and the output shafts O. The pump motor PM is electrically connected to the electricity accumulation device B via a second inverter 40. In the embodiment, in this way, the rotary electric machine MG which is controlled by the first inverter 30 and the pump motor PM which is controlled by the second inverter 40 are driven using the common electricity accumulation device B as the electric power source. A battery of a higher voltage (100 [V] or more) than an auxiliary battery (e.g. of 12 [V]) provided in the vehicle to serve as the electric power source for auxiliaries such as a compressor of an air conditioner and audio devices is used as the electricity accumulation device B.

The electric pump EOP discharges oil using torque of the pump motor PM with the pump motor PM rotating. Oil discharged from at least one of the mechanical pump and the electric pump EOP generates a hydraulic pressure to be supplied to a hydraulic servo mechanism (not illustrated) of the speed change mechanism TM to be used to control the state of engagement of the shifting engagement devices provided in the speed change mechanism TM. In addition, oil discharged from at least one of the mechanical pump and the electric pump EOP is also used to cool the rotary electric machine MG, lubricate various portions, and so forth. In the embodiment, with the provision of the electric pump EOP, oil can be supplied to the shifting engagement devices even when the internal combustion engine E is stationary to engage the shifting engagement devices to appropriately start the vehicle. The vehicle drive device 1 according to the embodiment may be suitably applied to a drive device for a hybrid vehicle having an idle stop function.

2. Schematic Configuration of Inverter Device

Figure 2:
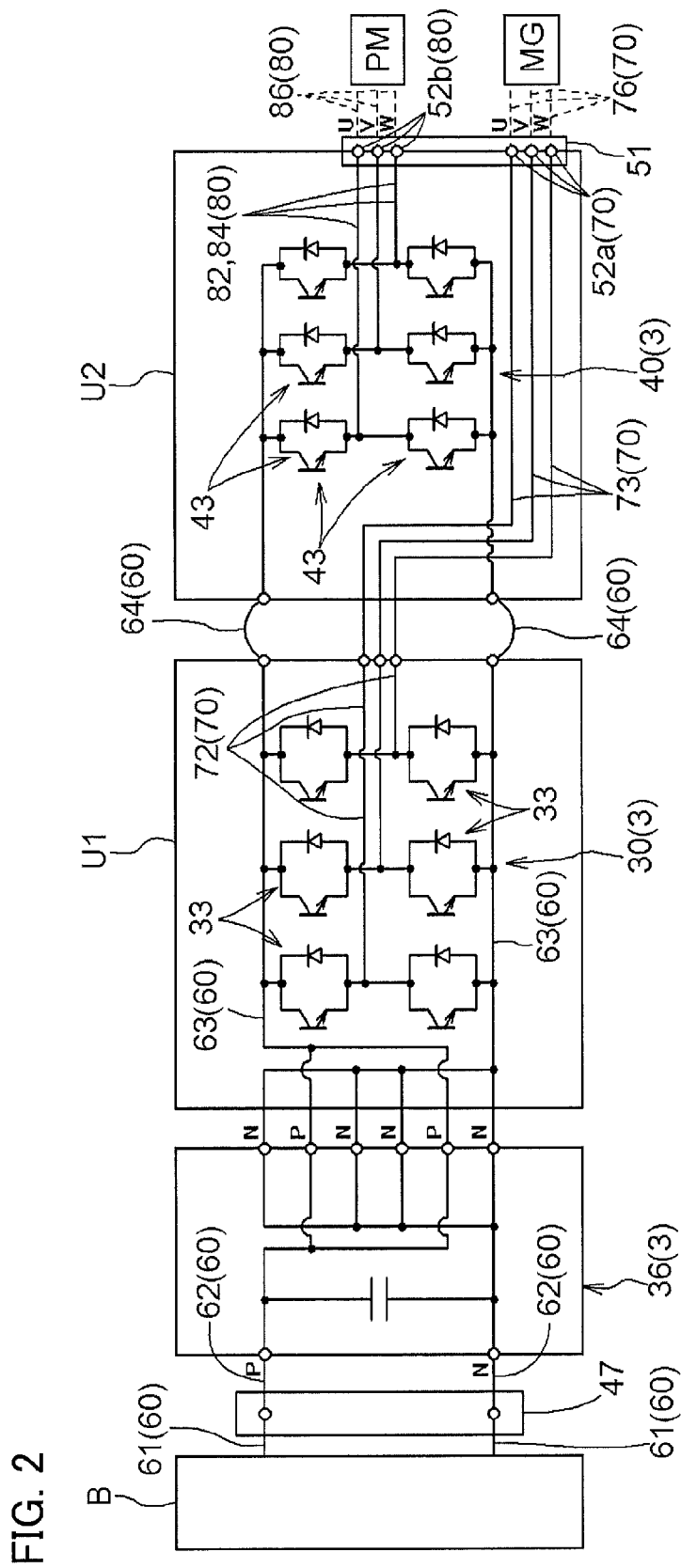
FIG. 2 is a circuit diagram of an inverter device.

An inverter device 3 performs conversion between DC power and AC power. As illustrated in FIG. 2, the inverter device 3 includes a smoothing capacitor 36, the first inverter 30, and the second inverter 40 which are connected between the electricity accumulation device B and the rotary electric machine MG and the pump motor PM. Specifically, the inverter device 3 includes the smoothing capacitor 36 which is connected between the electricity accumulation device B and the first inverter 30 and the second inverter 40, the first inverter 30 which is connected between the smoothing capacitor 36 and the rotary electric machine MG, and the second inverter 40 which is connected between the smoothing capacitor 36 and the pump motor PM. The smoothing capacitor 36, the first inverter 30, and the second inverter 40 are each unitized, and connected to each other.

As illustrated in FIG. 2, the smoothing capacitor 36 is connected between the positive electrode side and the negative electrode side (e.g. ground side) of the electricity accumulation device B which serves as a DC power source via DC power lines 61 and first bus bars 62 that compose a first wiring member 60. In addition, two switching elements 33 are connected in series between the positive electrode side and the negative electrode side of the smoothing capacitor 36 via second bus bars 63 that compose the first wiring member 60, and three sets of the series circuit are connected in parallel with each other. The three circuits correspond to three phases (U-phase, V-phase, and W-phase) of a stator coil of the rotary electric machine MG (stator St). A set of two switching elements 33 connected in parallel may be used in place of each of the switching elements 33 in the example of FIG. 2.

In the example, IGBTs are used as the switching elements 33. A collector of the switching element 33 in the upper stage for each phase is connected to the positive electrode side of the electricity accumulation device B and the smoothing capacitor 36 via the second bus bar 63 for the positive electrode. An emitter of the switching element 33 in the upper stage for each phase is connected to a collector of the switching element 33 in the lower stage. An emitter of the switching element 33 in the lower stage for each phase is connected to the negative electrode side of the electricity accumulation device B and the smoothing capacitor 36 via the second bus bar 63 for the negative electrode. A diode is connected in parallel between the emitter and the collector of each switching element 33. The diode is used as a Free Wheel Diode (FWD). MOSFETs or the like may also be used as the switching elements 33.

The pair of switching elements 33 in the upper stage and the lower stage are connected to first relay terminals 52a via third bus bars 72 and fourth bus bars 73 that compose a second wiring member 70. The pair of switching elements 33 for each phase are connected at an intermediate point therebetween (between the emitter and the collector) to the first relay terminal 52a for each phase via the third bus bar 72 and the fourth bus bar 73 for each phase. A current sensor configured to detect a current that flows through the stator coil of the rotary electric machine MG for each phase is provided around the first relay terminal 52a for each phase. The first relay terminal 52a for each phase is connected to the stator coil of the rotary electric machine MG for each phase via a first AC power line 76 that constitutes the second wiring member 70. A gate of each switching element 33 is connected to a drive circuit provided on a control substrate 34, and individually subjected to switching control.

In the embodiment, connection wires 64 are further connected to the second bus bars 63. Two switching elements 43 are connected in series between the positive electrode side and the negative electrode side of the electricity accumulation device B and the smoothing capacitor 36 via the second bus bars 63, the connection wires 64, and a circuit on a control substrate 44, and three sets of the series circuit are connected in parallel with each other. The three circuits correspond to three phases (U-phase, V-phase, and W-phase) of a stator coil of the pump motor PM. In the example, IGBTs are used as the switching elements 43. However, MOSFETs or the like may also be used. The connection relationship between the switching elements 43 is the same as that in the first inverter 30.

The pair of switching elements 43 in the upper stage and the lower stage are connected to second relay terminals 52b via fifth bus bars 82 that compose a third wiring member 80. The pair of switching elements 43 for each phase are connected at an intermediate point therebetween to the second relay terminal 52b for each phase via the fifth bus bar 82 for each phase. The second relay terminal 52b for each phase is connected to the stator coil of the pump motor PM for each phase via a second AC power line 86 that constitutes the third wiring member 80. A gate of each switching element 43 is connected to a drive circuit provided on the control substrate 44, and individually subjected to switching control.

Based on such an inverter circuit, the first inverter 30 converts electric power between DC power exchanged with the electricity accumulation device B and AC power (three-phase AC power) exchanged with the rotary electric machine MG In addition, the second inverter 40 converts electric power between DC power exchanged with the electricity accumulation device B and AC power (three-phase AC power) exchanged with the pump motor PM. In the embodiment, the first inverter 30 and the second inverter 40 share the high-voltage electricity accumulation device B and the smoothing capacitor 36.

3. Fixing Structure for Inverter Device

Figure 5:
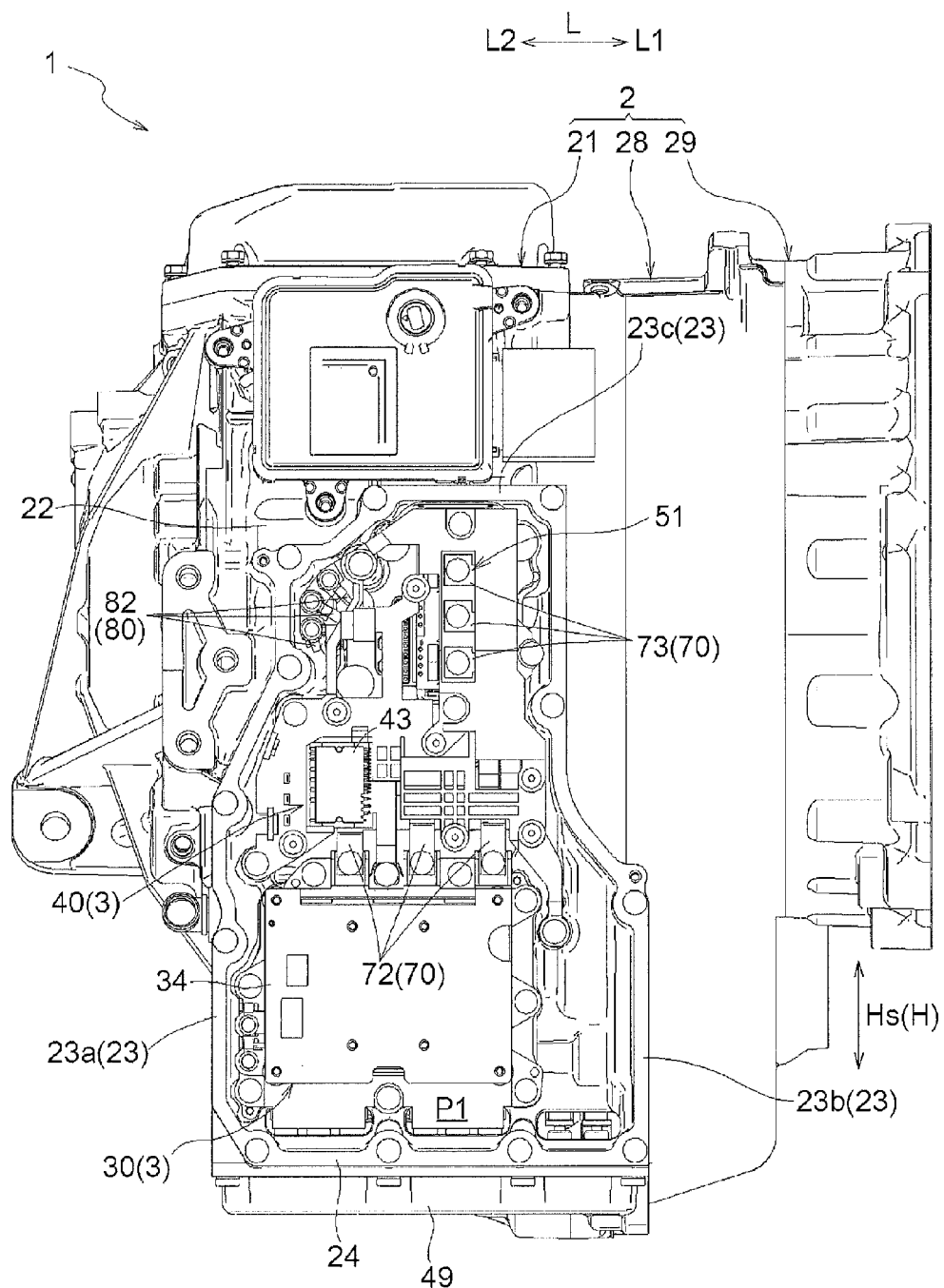
FIG. 5 illustrates the vehicle drive device as seen in the vertical direction.

In the embodiment, as illustrated in FIG. 5, the case 2 includes a first case portion 21 and a second case portion 28 formed to be split in the axial direction L. The first case portion 21 forms an accommodation space mainly for the speed change mechanism TM and the gear mechanism C. The electric pump EOP and the pump motor PM are also disposed in the first case portion 21 (see FIG. 3). The second case portion 28 forms an accommodation space mainly for the rotary electric machine MG and the engagement device CL. A space obtained by adding the accommodation spaces for the speed change mechanism TM, the gear mechanism C, the electric pump EOP, the pump motor PM, the rotary electric machine MG, and the engagement device CL is a closed space (see FIG. 9) formed oil-tightly in the case 2. In the embodiment, the closed space is referred to as a "drive element accommodation chamber Q". In the embodiment, an accommodation space for the differential gear device DF is formed to extend between the first case portion 21 and the second case portion 28 (also see FIG. 6). The second case portion 28 is joined to the first case portion 21 from the side in the first axial direction L1.

In the example, in addition, the vehicle drive device 1 includes a damper, and a third case portion 29 that forms an accommodation space for the damper is joined to the second case portion 28 from the side in the first axial direction L1. In this way, the third case portion 29, the second case portion 28, and the first case portion 21 are disposed such that the distance of spacing from the internal combustion engine E along the axial direction L becomes longer in the order in which they are mentioned.

As illustrated in FIG. 3, the inverter device 3 (including the first inverter 30 and the second inverter 40) is integrally attached to the case 2. The inverter device 3 is integrally fixed to the case 2 directly, not via an inverter case that accommodates the inverter device 3 or the like. That is, the vehicle drive device 1 according to the embodiment adopts an inverter case-less structure. With such an inverter case-less structure, it is not necessary to prepare a dedicated inverter case as a matter of course, or it is not necessary to prepare a fixation seat for fixation of the inverter case to the case 2. Hence, it is possible to reduce the cost by reducing the number of parts. In addition, the entire device can be downsized.

Figure 9:
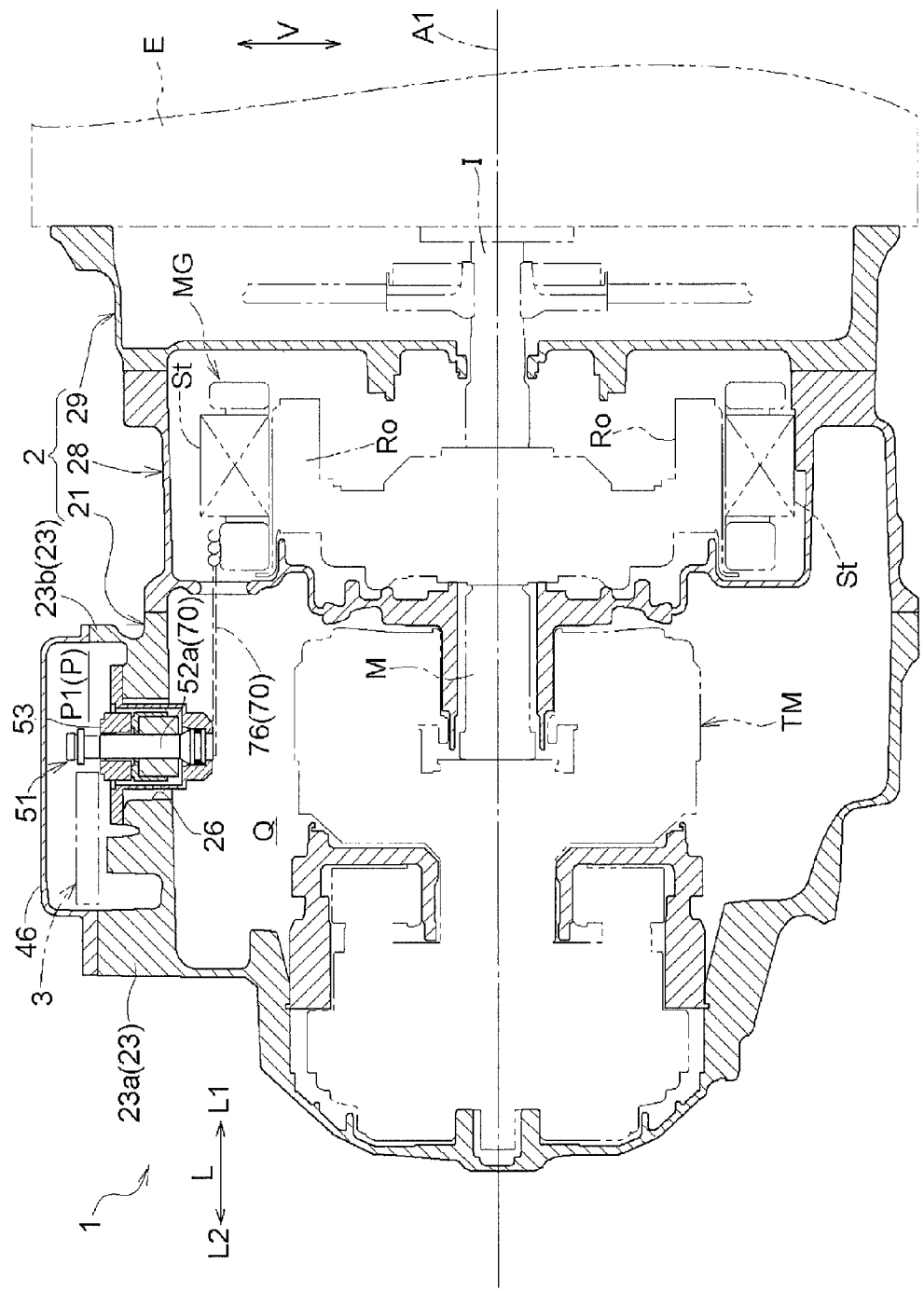
FIG. 9 is a schematic view illustrating the arrangement relationship of constituent parts as seen in a particular horizontal direction.

In the embodiment, as illustrated in FIGS. 5 and 9, the inverter device 3 is fixed to the first case portion 21 which accommodates the speed change mechanism TM etc., not to the second case portion 28 which accommodates the rotary electric machine MG etc. The inverter device 3 is disposed so as to overlap the speed change mechanism TM without overlapping the rotary electric machine MG as seen in the radial direction. In the embodiment, in order to suppress the length of the entire device in the axial direction L to be short, the rotary electric machine MG which is large in diameter and thin is used. Therefore, the speed change mechanism TM is shaped to be smaller in diameter and longer in the axial direction L than the rotary electric machine MG Consequently, an annular space having an axial length matching the length of the speed change mechanism TM in the axial direction L is formed on the radially outer side of the speed change mechanism TM because of the difference between the outside diameter of the rotary electric machine MG and the outside diameter of the speed change mechanism TM. Thus, the entire vehicle drive device 1 including the integrated inverter device 3 can be downsized by disposing the inverter device 3 effectively utilizing at least a part of the annular space. In addition, the inverter device 3 is fixed to the first case portion 21 which is disposed opposite to the internal combustion engine E with respect to the second case portion 28. By disposing the inverter device 3 with more spacing from the internal combustion engine E in this way, it is possible to prevent radiant heat from the internal combustion engine E from reaching the inverter device 3.

Figure 4:
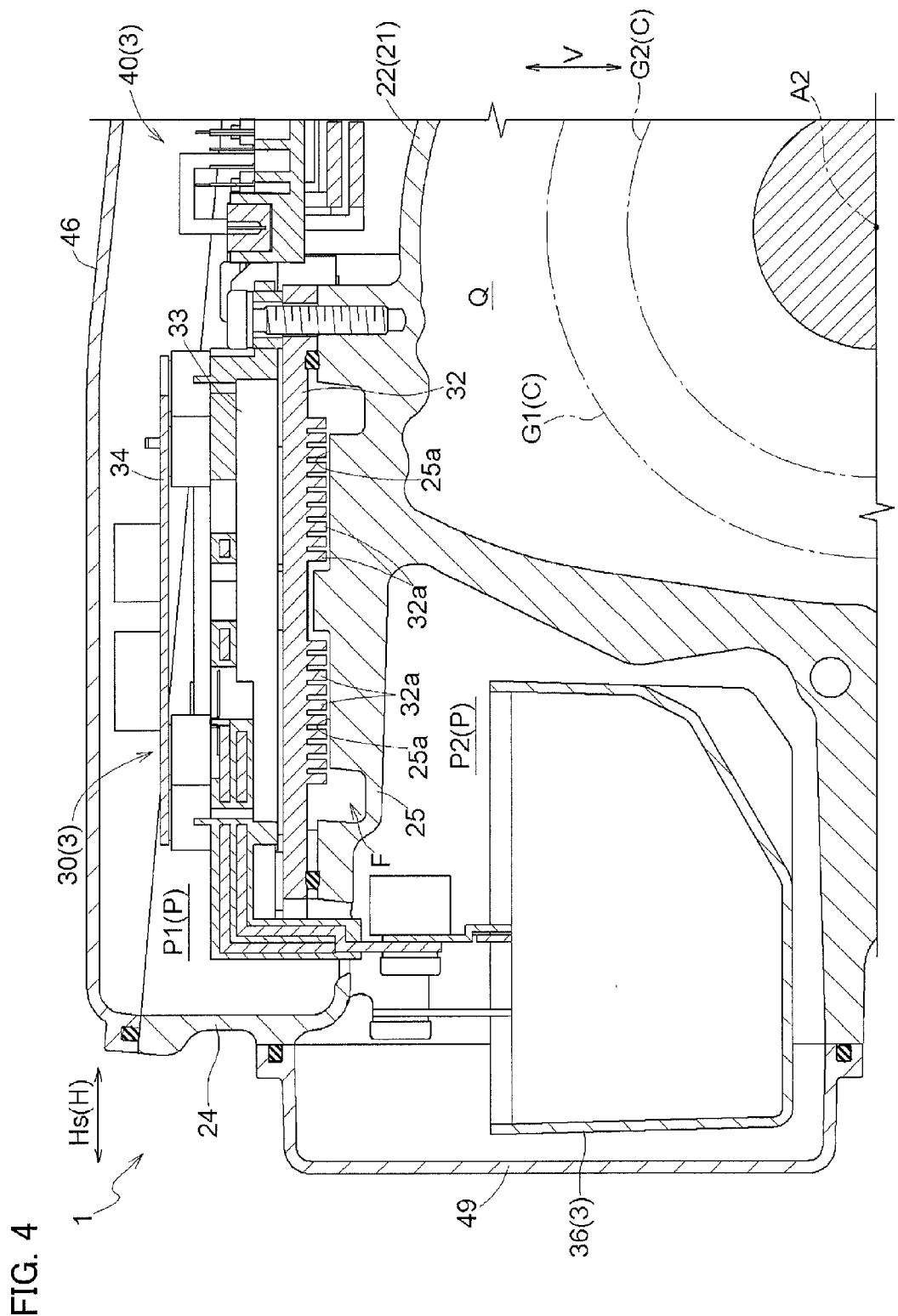
FIG. 4 is a partial enlarged view of FIG. 3.

As illustrated in FIG. 4, the first inverter 30 includes a base plate 32 in a flat shape, and the plurality of switching elements 33 are fixed to the base plate 32. The base plate 32 is constituted of a highly thermally conductive material (e.g. a metal material such as copper or aluminum), and also functions as a heat sink. The diodes are also fixed to the base plate 32.

Fins 32a are formed on a surface (non-element disposed surface) of the base plate 32 that is opposite to a surface (element disposed surface) on which the switching elements 33 are disposed. The fins 32a are formed to stand upright along the direction of the normal to the base plate 32. The fins 32a may have various shapes such as a plate shape and a pin shape. In addition, the control substrate 34 which controls switching of the switching elements 33 is fixed to the base plate 32. The control substrate 34 is disposed in parallel with the base plate 32 on the side opposite to the base plate 32 with respect to the switching elements 33. The first inverter 30 is unitized in a flat rectangular parallelepiped shape as a whole.

In the embodiment, the switching elements 43 which compose the second inverter 40 are integrated with the control substrate 44 which controls the switching elements 43. That is, as indicated by the broken line in FIG. 7, the plurality of switching elements 43 are modularized into a switching element module, which is integrally fixed to the lower surface of the control substrate 44. As with the first inverter 30, the second inverter 40 is also unitized in a flat shape as a whole (also see FIG. 3). In the embodiment, the control substrate 44 corresponds to the "substrate" according to the present disclosure.

The smoothing capacitor 36 smoothes (suppresses fluctuations in) DC power exchanged between the electricity accumulation device B and the first inverter 30 and the second inverter 40. A film capacitor made from a synthetic resin, a ceramic capacitor made from an inorganic material, or the like may be used as the smoothing capacitor 36. Such a smoothing capacitor 36 has a relatively large degree of freedom in design in terms of the size and the shape, and can be adjusted in accordance with the size and the shape of the space in which the smoothing capacitor 36 is disposed. In the example, the smoothing capacitor 36 is formed in the shape of a rectangular parallelepiped (block) with low flatness compared to the first inverter 30 and the second inverter 40.

Figure 6:
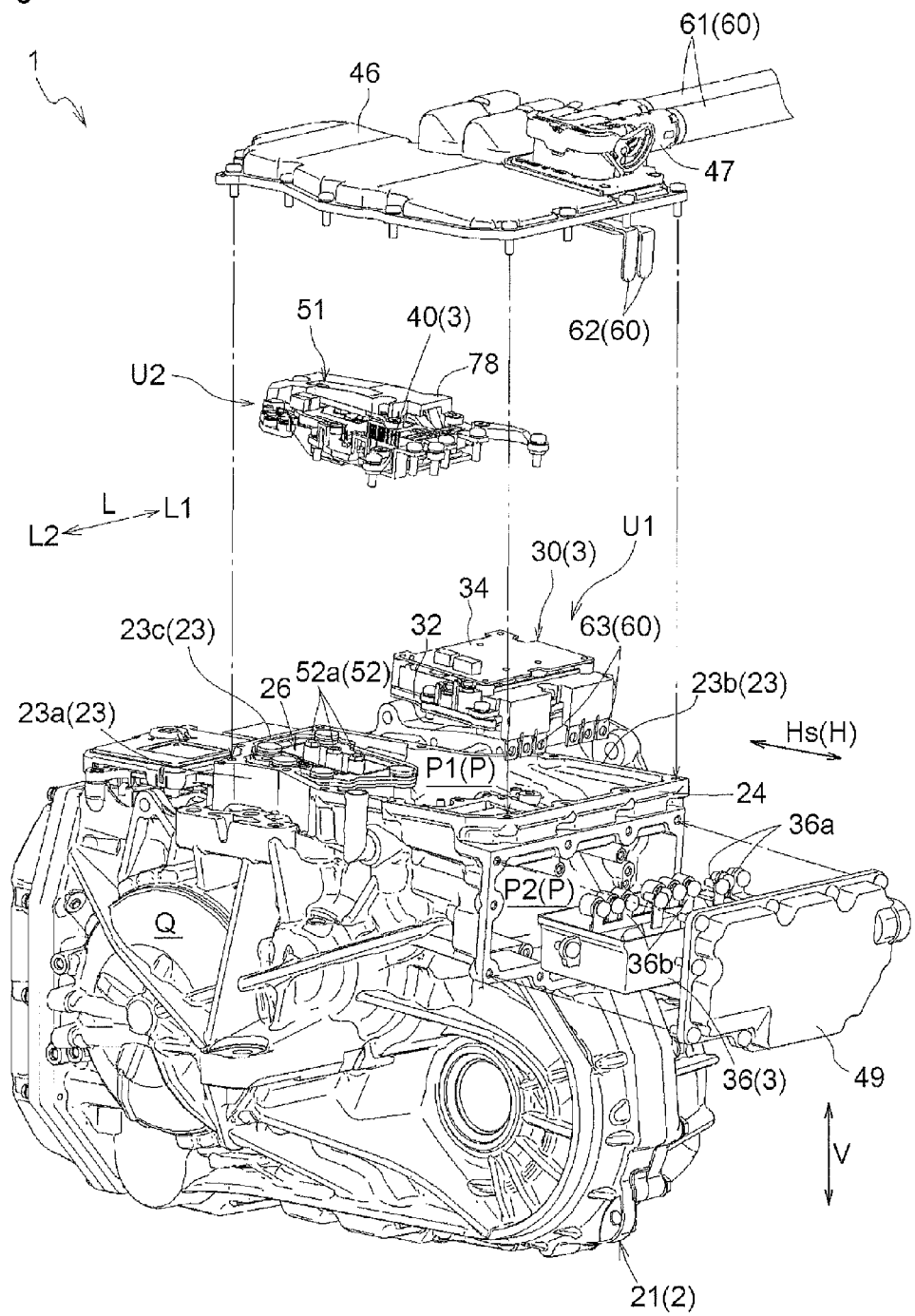
FIG. 6 is an exploded perspective view of the vehicle drive device.

As illustrated in FIG. 6, the first inverter 30 and the second inverter 40 and the smoothing capacitor 36 are fixed at different positions in the outer peripheral portion (specifically, a region along an outer peripheral wall 22) of the first case portion 21. The outer peripheral wall 22 is formed in the shape of an oddly shaped tube along the outer shape of the speed change mechanism TM, the gear mechanism C, and the differential gear device DF which are constituent parts with the three axes as seen in the axial direction L. The first case portion 21 includes a projecting wall 23 that projects toward the outer side (in the example, mainly vertically upward) from the outer peripheral wall 22. As illustrated in FIGS. 5 and 6, the projecting wall 23 includes a pair of opposing wall portions 23a and 23b disposed to extend in a direction that crosses the axial direction L at different positions in the axial direction L so as to oppose each other, and a coupling wall portion 23c that connects between respective end portions of the opposing wall portions 23a and 23b on one side. The opposing wall portions 23a and 23b and the coupling wall portion 23c are formed integrally with each other. The opposing wall portions 23a and 23b are formed to cover the entire region occupied by the three axes A1, A2, and A3 in a particular horizontal direction Hs (see FIG. 3). As illustrated in FIG. 3 etc., the particular horizontal direction Hs is a horizontal direction H that is orthogonal to the axial direction L. The coupling wall portion 23c is disposed on the side opposite to the third axis A3 with respect to the first axis A1 in the particular horizontal direction Hs.

As illustrated in FIGS. 5 and 6, the first case portion 21 includes a beam portion 24 in the shape of a column or a plate formed at distal end portions (vertically upper end portions), in the direction of projection, of respective end portions of the pair of opposing wall portions 23a and 23b that are opposite to the coupling wall portion 23c to connect between the pair of opposing wall portions 23a and 23b. The opposing wall portions 23a and 23b and the beam portion 24 are formed integrally with each other. The projecting wall 23 and the beam portion 24 are formed such that the upper end portions (upper surfaces) thereof extend along the horizontal direction H. In addition, such components are formed such that side surfaces thereof on the outer side in the particular horizontal direction Hs extend along the vertical direction V.

As illustrated in FIGS. 3 and 4, the first case portion 21 includes a separation wall 25 that projects outward (in the example, mainly outward in the particular horizontal direction Hs) from the highest position of the outer peripheral wall 22 in the vicinity of an accommodation portion for the gear mechanism C. The separation wall 25 has a predetermined thickness, and is formed in the shape of a thick plate that extends along the horizontal direction H. The separation wall 25 is formed to extend along the particular horizontal direction Hs to a position at which the separation wall 25 opposes the beam portion 24 via a predetermined gap. Such a separation wall 25 separates a space defined in a region over which the pair of opposing wall portions 23a and 23b oppose each other along the outer peripheral wall 22 of the first case portion 21 into two spaces.

The two spaces formed along the outer peripheral wall 22 of the first case portion 21 are a first accommodation portion P1 that accommodates the first inverter 30 and the second inverter 40 and a second accommodation portion P2 that accommodates the smoothing capacitor 36. That is, the first case portion 21 has, in the outer peripheral portion thereof, the first accommodation portion P1 which accommodates the first inverter 30 and the second inverter 40 and the second accommodation portion P2 which accommodates the smoothing capacitor 36. The separation wall 25 described earlier may also be considered as separating between the first accommodation portion P1 and the second accommodation portion P2. As illustrated in FIG. 5, the first inverter 30 and the second inverter 40 are disposed adjacent to each other in the particular horizontal direction Hs in the first accommodation portion P1. In the example, the first inverter 30 is disposed in a wide region on the beam portion 24 side, and the second inverter 40 which is smaller than the first inverter 30 is disposed in a narrow region on the coupling wall portion 23c side.

In the embodiment, a space obtained by adding the two spaces defined by the first accommodation portion P1 and the second accommodation portion P2 is referred to as a "control element accommodation chamber P". The control element accommodation chamber P is formed along the outer peripheral wall 22 of the first case portion 21. As illustrated in FIGS. 3 and 9, the control element accommodation chamber P and the drive element accommodation chamber Q discussed above communicate with each other via a communication hole 26 formed in the outer peripheral wall 22 of the first case portion 21. In the example, the control element accommodation chamber P and the drive element accommodation chamber Q communicate with each other via only the communication hole 26, and are completely separated from each other at portions other than the communication hole 26. In the vehicle mounted state, the communication hole 26 is disposed above the surface of oil stored in the drive element accommodation chamber Q. More particularly, the communication hole 26 is disposed above the highest point that can be reached by the oil surface which fluctuates in the drive element accommodation chamber Q during travel of the vehicle. In the embodiment, the communication hole 26 is disposed above the upper end portion of the speed change mechanism TM. Further, the communication hole 26 is disposed in the uppermost end region of the outer peripheral wall 22 of the first case portion 21.

As illustrated in FIG. 4, the separation wall 25 includes recessed portions 25a formed to be dented in a recessed shape in a surface on the first accommodation portion P1 side. The first inverter 30 (specifically, the base plate 32) is fixed to the separation wall 25 with the fins 32a accommodated in the recessed portions 25a. The separation wall 25 and the base plate 32 are joined to each other in a liquid-tight manner with a seal member or the like interposed therebetween, for example. A space defined by the recessed portions 25a between the separation wall 25 and the base plate 32 functions as a cooling water path F that allows circulation of cooling water (an example of a cooling liquid). In the embodiment, in this way, the cooling water path F is formed in the separation wall 25 which separates between the first accommodation portion P1 and the second accommodation portion P2. The cooling water path F is formed along the first inverter 30. In addition, the cooling water path F is disposed on the speed change mechanism TM side (gear mechanism C side) with respect to the first inverter 30.

Cooling water introduced into the cooling water path F passes between the fins 32a to be circulated. In this event, the switching elements 33 are cooled through heat exchange via the base plate 32. Consequently, the switching elements 33 which generate heat along with switching operation can be effectively cooled. In the structure according to the embodiment, in addition, the cooling water path F is interposed between the first inverter 30 and drive device constituent parts such as the speed change mechanism TM and the gear mechanism C. Therefore, the first inverter 30 can be thermally shielded from the drive device constituent parts which tend to be relatively hot. Hence, the first inverter 30 (switching elements 33) can be effectively thermally protected.

As illustrated in FIGS. 5 and 6, the upper surfaces of the projecting wall 23 (the pair of opposing wall portions 23a and 23b and the coupling wall portion 23c) and the beam portion 24 which are integrated are formed in a frame shape as seen in the vertical direction V in the vehicle mounted state. The first accommodation portion P1 is formed in a space inside the frame shape. In addition, the side surfaces of the projecting wall 23 (pair of opposing wall portions 23a and 23b) and the beam portion 24 which are integrated are formed in a frame shape also utilizing a part of the outer peripheral wall 22 as seen in the particular horizontal direction Hs in the vehicle mounted state. The second accommodation portion P2 is formed in a space inside the frame shape. The first accommodation portion P1 and the second accommodation portion P2 open toward the outside of the first case portion 21 and in different directions. Specifically, in the vehicle mounted state, the first accommodation portion P1 opens upward, and the second accommodation portion P2 opens laterally (along the particular horizontal direction Hs).

The first inverter 30 and the second inverter 40 can be inserted into the first accommodation portion P1 in the vertical direction V to be fixed to the first case portion 21. In this event, the first inverter 30 and the second inverter 40 are disposed side by side in the particular horizontal direction Hs. The smoothing capacitor 36 can be inserted into the second accommodation portion P2 in the particular horizontal direction Hs to be fixed to the first case portion 21. In this event, the smoothing capacitor 36 and the first inverter 30 are disposed side by side in the vertical direction V. The first inverter 30 and the second inverter 40 and the smoothing capacitor 36 can be fixed to the first case portion 21 through independent processes. With the first inverter 30, the second inverter 40, and the smoothing capacitor 36 fixed to the first case portion 21, a first cover 46 is attached so as to block an opening portion in the vertical direction V, and a second cover 49 is attached so as to block an opening portion in the particular horizontal direction Hs. The first cover 46 is provided with a power source connector 47 to which the DC power lines 61 that extend from the electricity accumulation device B are connected.

4. Electrical Connection Structure Centered on Inverter Device

As illustrated in FIG. 2, the electricity accumulation device B, the inverter device 3 (here, in particular, the first inverter 30 and the second inverter 40), the rotary electric machine MG, and the pump motor PM are electrically connected to each other through the first wiring member 60, the second wiring member 70, and the third wiring member 80. The electricity accumulation device B and the first inverter 30 and the second inverter 40 are electrically connected to each other through the first wiring member 60. The first inverter 30 and the rotary electric machine MG are electrically connected to each other through the second wiring member 70. The second inverter 40 and the pump motor PM are electrically connected to each other through the third wiring member 80.

The first wiring member 60 includes the DC power lines 61, the first bus bars 62, the second bus bars 63, and the connection wires 64. The DC power lines 61 are constituted as a cable that extends from the electricity accumulation device B, and connect between the electricity accumulation device B and the power source connector 47 (also see FIG. 6) outside the control element accommodation chamber P and the drive element accommodation chamber Q. The first bus bars 62 are constituted of a belt-like conductive plate made of metal, and connect between the power source connector 47 and the smoothing capacitor 36 in the control element accommodation chamber P. The first bus bars 62 include a bus bar for the positive electrode and a bus bar for the negative electrode. The first bus bar 62 for each electrode is connected to a terminal of the smoothing capacitor 36 on the electricity accumulation device B side for each electrode. The second bus bars 63 are constituted of a belt-like conductive plate made of metal, and connect between the smoothing capacitor 36 and the first inverter 30 in the control element accommodation chamber P. The second bus bars 63 include a bus bar for the positive electrode and a bus bar for the negative electrode. The second bus bar 63 for each electrode is connected to a terminal of the switching element 33 for each phase. The connection wires 64 are constituted of a conductive wire made of metal in the example, and connect between the second bus bars 63 and the second inverter 40 in the control element accommodation chamber P. The connection wires 64 include a wire for the positive electrode and a wire for the negative electrode. In this way, the first wiring member 60 is branched into two systems in the control element accommodation chamber P to be connected to each of the first inverter 30 and the second inverter 40. The DC power lines 61, the first bus bars 62, the second bus bars 63, and the connection wires 64 are provided as electrically insulated from each other.

Figure 7:
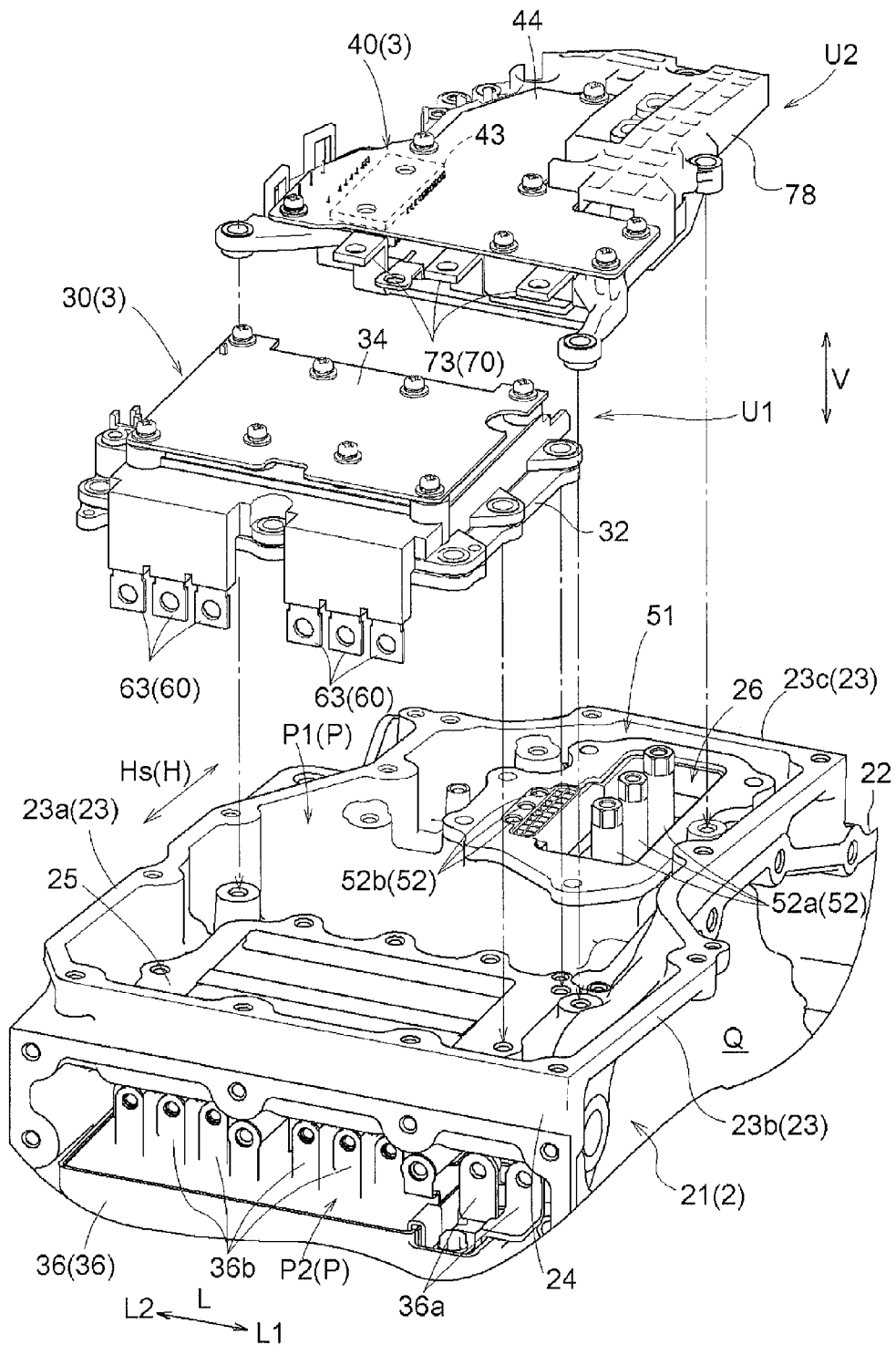
FIG. 7 is a partial exploded perspective view of the inverter device.
Figure 8:
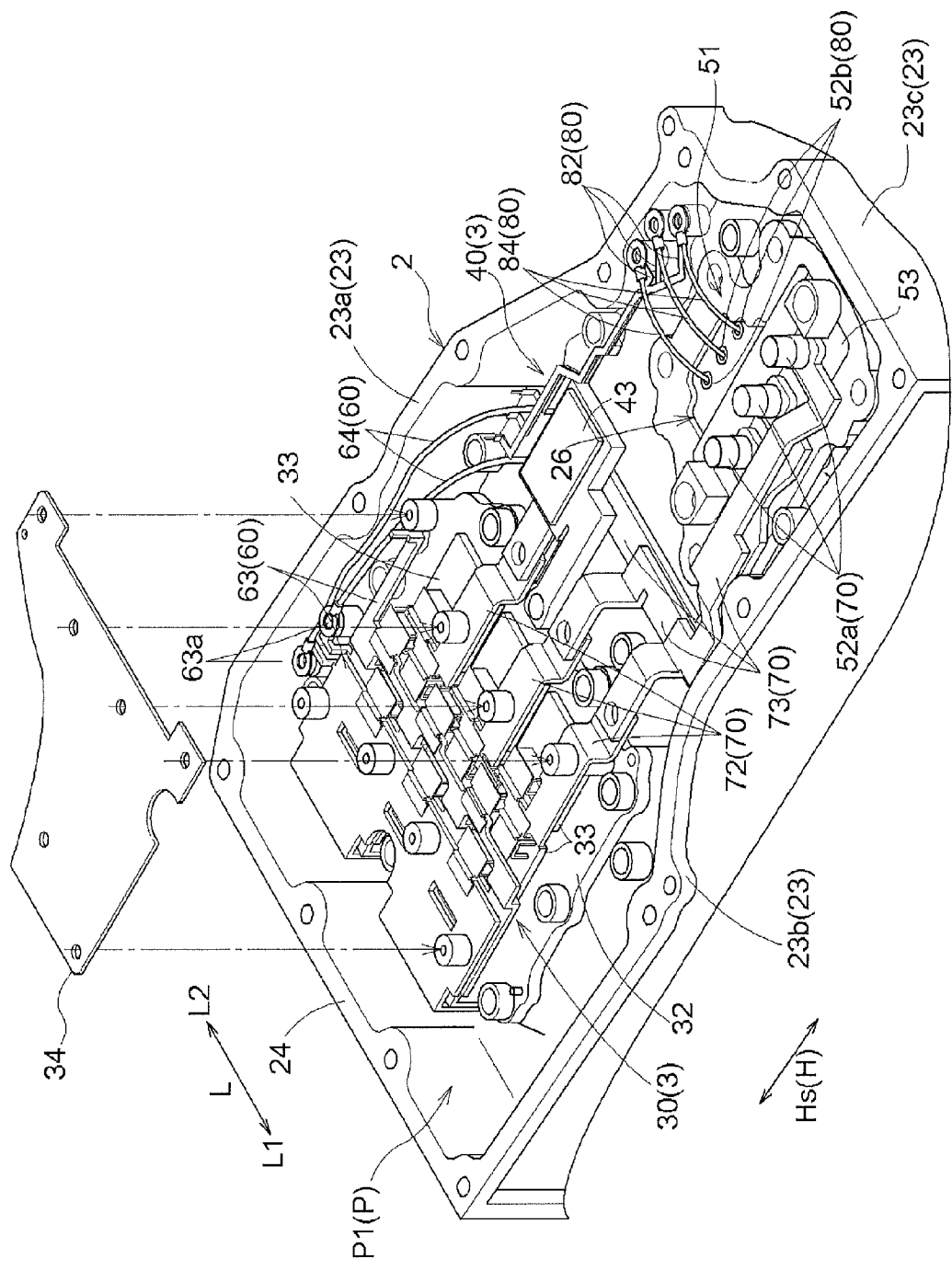
FIG. 8 is a perspective view illustrating the main wiring structure of the inverter device.

The first bus bars 62 extend along the particular horizontal direction Hs from the power source connector 47, and thereafter extend along the vertical direction V to be connected to power source-side terminals 36a provided at an end portion of the smoothing capacitor 36 on the side in the first axial direction L1 (see FIG. 6). As illustrated in FIGS. 6 and 7, inverter-side terminals 36b of the smoothing capacitor 36 are provided on the upper surface side of the smoothing capacitor 36 so as to be arranged side by side along the axial direction L together with the power source-side terminals 36a. The second bus bars 63 extend along the vertical direction V from the inverter-side terminals 36b of the smoothing capacitor 36, and thereafter extend along the particular horizontal direction Hs to be connected to terminals of the switching elements 33. In the embodiment, portions of the second bus bars 63 that extend in the vertical direction V are formed to be separate in the axial direction L so as to correspond to respective halves of the plurality of inverter-side terminals 36b, and portions of the second bus bars 63 that extend in the particular horizontal direction Hs are formed to be continuous in the axial direction L. As illustrated in FIG. 8, branch terminals 63a configured to supply DC power from the electricity accumulation device B after being smoothed also to the second inverter 40 are provided at an end portion, on the side in the second axial direction L2, of portions of the second bus bars 63 that extend in the particular horizontal direction Hs. The connection wires 64 are connected to the branch terminals 63a to be connected to terminals of the switching elements 43 of the second inverter 40.

The second wiring member 70 includes the third bus bars 72, the fourth bus bars 73, the first relay terminals 52a provided to the terminal block 51, and the first AC power lines 76. The third bus bars 72 are constituted of a belt-like conductive plate made of metal, and connect between terminals of the switching elements 33 and the fourth bus bars 73 in the control element accommodation chamber P. The fourth bus bars 73 are constituted of a belt-like conductive plate made of metal, and connect between the third bus bars 72 and the first relay terminals 52a in the control element accommodation chamber P. The third bus bars 72 and the fourth bus bars 73 include a bus bar for U-phase, a bus bar for V-phase, and a bus bar for W-phase. The first relay terminals 52a are constituted as a bar-like member made of metal, and disposed to penetrate the communication hole 26 of the first case portion 21 such that both end portions of the first relay terminals 52a are positioned in the control element accommodation chamber P and in the drive element accommodation chamber Q respectively. The first relay terminals 52a include a relay terminal for U-phase, a relay terminal for V-phase, and a relay terminal for W-phase. The switching element 33 for each phase is connected to the first relay terminal 52a for each phase via the third bus bar 72 and the fourth bus bar 73 for each phase. The first AC power lines 76 are constituted as a cable that extends from the stator coil of the rotary electric machine MG, and connect between the first relay terminals 52a and the stator coil in the drive element accommodation chamber Q (see FIG. 9). In the embodiment, the first relay terminals 52a correspond to the "relay terminal" according to the present disclosure. The third bus bars 72, the fourth bus bars 73, the first relay terminals 52a, and the first AC power lines 76 are provided as electrically insulated from each other.

In the embodiment, as illustrated in FIG. 8, two switching elements 33 for the same phase are disposed side by side in the particular horizontal direction Hs, and three sets of the two switching elements 33 for each phase are disposed side by side in the axial direction L. The third bus bars 72 are formed to extend along the particular horizontal direction Hs from the switching elements 33 for each phase. The third bus bars 72 and the fourth bus bars 73 are disposed so as to overlap each other as seen in the vertical direction V in a boundary region between the wide region and the narrow region in the first accommodation portion P1. Such components are connected to each other in their overlapping portions. With regard to the arrangement of two members, the phrase "overlap each other as seen in a certain direction" means that when an imaginary line that is parallel to the viewing direction is moved in directions that are orthogonal to the imaginary line, the imaginary line crosses both of the two members in at least some region.

In the embodiment, the switching elements 43 of the second inverter 40 are disposed in a region of the first accommodation portion P1 on the side in the second axial direction L2 (on the opposing wall portion 23a side). The fourth bus bars 73 are formed to extend along the particular horizontal direction Hs as a whole from the switching elements 33 for each phase. In this event, the fourth bus bars 73 for each phase are disposed so as to overlap each other as seen in the vertical direction V in a region of the first accommodation portion P1 on the side in the first axial direction L1 (on the opposing wall portion 23b side), which is opposite to the side of the switching elements 43. The fourth bus bars 73 for each phase, which overlap each other as seen in the vertical direction V, are disposed along the opposing wall portion 23b. The fourth bus bars 73 for each phase are connected to the first relay terminals 52a for each phase which are disposed side by side in the particular horizontal direction Hs. In this event, in order to suppress fluctuations in path length to be as small as possible, the fourth bus bar 73 for a phase, the portion of connection with the third bus bar 72 which is relatively positioned closer to the side in the second axial direction L2, is connected to the first relay terminal 52a which is positioned closer to the first inverter 30.

The third wiring member 80 includes the fifth bus bars 82, harnesses 84, the second relay terminals 52b provided to the terminal block 51, and the second AC power lines 86. The fifth bus bars 82 are constituted of a belt-like conductive plate made of metal, and connect between terminals of the switching elements 43 and the harnesses 84 in the control element accommodation chamber P. The fifth bus bars 82 include a bus bar for U-phase, a bus bar for V-phase, and a bus bar for W-phase. The harnesses 84 are constituted of a conductive wire made of metal, and connect between the fifth bus bars 82 and the second relay terminals 52b in the control element accommodation chamber P. The harnesses 84 include a wire for U-phase, a wire for V-phase, and a wire for W-phase. The second relay terminals 52b are constituted as a bar-like member made of metal, and disposed to penetrate the communication hole 26 of the first case portion 21 such that both end portions of the second relay terminals 52b are positioned in the control element accommodation chamber P and in the drive element accommodation chamber Q respectively. The second relay terminals 52b include a relay terminal for U-phase, a relay terminal for V-phase, and a relay terminal for W-phase. The switching element 43 for each phase is connected to the second relay terminal 52b for each phase via the fifth bus bar 82 and the harness 84 for each phase. The second AC power lines 86 are constituted as a cable that extends from the stator coil of the pump motor PM, and connect between the second relay terminals 52b and the stator coil in the drive element accommodation chamber Q (see FIG. 3). The fifth bus bars 82, the harnesses 84, the second relay terminals 52b, and the second AC power lines 86 are provided as electrically insulated from each other.

In the embodiment, as illustrated in FIG. 8, the fifth bus bars 82 are formed to extend along the particular horizontal direction Hs as a whole. In this event, the fifth bus bars 82 for each phase are disposed so as to overlap each other as seen in the vertical direction V in a region of the first accommodation portion P1 on the side in the second axial direction L2 (on the opposing wall portion 23a side). The fifth bus bars 82 for each phase, which overlap each other as seen in the vertical direction V, are disposed along the opposing wall portion 23a. The fifth bus bars 82 for each phase are connected to the second relay terminals 52b for each phase, which are disposed side by side in the particular horizontal direction Hs, via the harnesses 84. In the embodiment, the pump motor PM for driving the electric pump EOP generates low torque compared to the rotary electric machine MG for driving the wheels W, and is driven by a low current. Therefore, the fifth bus bars 82 are small in size (small in area of the cross section that is orthogonal to the direction of extension) compared to the third bus bars 72 and the fourth bus bars 73. Likewise, the second relay terminals 52b are small in size (small in outside diameter) compared to the first relay terminals 52a.

As illustrated in FIG. 7, the base plate 32, the switching elements 33, and the control substrate 34 which compose the first inverter 30, the plurality of second bus bars 63 which compose the first wiring member 60, and the plurality of third bus bars 72 which compose the second wiring member 70 are composed integrally. That is, such components are assembled to compose an integral first unit U1. In addition, the plurality of fourth bus bars 73 which compose the second wiring member 70 and the switching elements 43 and the control substrate 44 which compose the second inverter 40 are composed integrally. That is, such components are assembled to compose an integral second unit U2. The plurality of fourth bus bars 73 and the switching elements 43 and the control substrate 44 are integrally held by a holding member 78 constituted of an insulating material such as a resin, for example. In the embodiment, the fourth bus bars 73 correspond to the "bus bar" according to the present disclosure.

In the embodiment, in this way, the first wiring member 60 which extends from the electricity accumulation device B is branched into two systems in the case 2 to be connected to each of the first inverter 30 and the second inverter 40. The term "in the case 2" represents a space obtained by adding the drive element accommodation chamber Q and the control element accommodation chamber P. In the embodiment, the first wiring member 60 is branched in the control element accommodation chamber P to be connected to each of the first inverter 30 and the second inverter 40. Hence, wiring from the electricity accumulation device B to the vehicle drive device 1 can be simplified. The first relay terminals 52a which compose the second wiring member 70 which extends from the first inverter 30 and the second relay terminals 52b which compose the third wiring member 80 which extends from the second inverter 40 are held by the common terminal block 51 (holding block 53) which is disposed in the communication hole 26. Consequently, both the second wiring member 70 which connects between the first inverter 30 and the rotary electric machine MG and the third wiring member 80 which connects between the second inverter 40 and the pump motor PM are routed through the communication hole 26. Therefore, entry of oil in the drive element accommodation chamber Q into the control element accommodation chamber P can be effectively suppressed by just sealing the periphery of the communication hole 26. That is, the control element accommodation chamber P can be appropriately maintained in an oil-free state while reducing the portion to be sealed.

Hence, the structure can be simplified while securing oil-tightness.

5. Other Embodiments

Lastly, vehicle drive devices according to other embodiments of the present disclosure will be described. A configuration disclosed in each of the following embodiments may be applied in combination with a configuration disclosed in any other embodiment unless any contradiction occurs.

(1) In the embodiment described above, both the second wiring member 70 and the third wiring member 80 pass through the common communication hole 26 to be routed. However, embodiments of the present disclosure are not limited thereto. For example, two communication holes may be formed in the first case portion 21, and the second wiring member 70 and the third wiring member 80 may be routed through the different communication holes. In this case, the terminal block 51 which has the first relay terminals 52a and the second relay terminals 52b may be formed separately in accordance with the positions of the two communication holes, or may be formed integrally in the case where the two communication holes are proximate to each other.

(2) In the embodiment described above, in the vehicle mounted state, the communication hole 26 is disposed in the uppermost region of the outer peripheral wall 22 of the first case portion 21. However, embodiments of the present disclosure are not limited thereto. The communication hole 26 may be disposed in a region below the uppermost portion of the outer peripheral wall 22. For example, the communication hole 26 may be disposed so as to overlap the gear mechanism C as seen in the particular horizontal direction Hs. In addition, the communication hole 26 may be disposed below the upper end portion of the speed change mechanism TM. The communication hole 26 is preferably disposed at least above the surface of oil stored in the drive element accommodation chamber Q. However, the communication hole 26 is not hindered from being disposed below the oil surface.

(3) In the embodiment described above, the base plate 32, the switching elements 33, the control substrate 34, the second bus bars 63, and the third bus bars 72 are assembled to compose the first unit U1. In addition, the fourth bus bars 73, the switching elements 43, and the control substrate 44 are assembled to compose the second unit U2. However, embodiments of the present disclosure are not limited thereto. The constituent parts of at least one of such units may be assembled individually without being unitized. Alternatively, the first unit U1 and the second unit U2 may be composed of combinations of components that are different from those according to the embodiment described above. Alternatively, the entirety of the first unit U1 and the second unit U2 may be unitized into a single unit.

(4) In the embodiment described above, the smoothing capacitor 36 and the first inverter 30 are disposed side by side in the vertical direction V, and the first inverter 30 and the second inverter 40 are disposed side by side in the particular horizontal direction Hs. However, embodiments of the present disclosure are not limited thereto. For example, the entirety of the smoothing capacitor 36, the first inverter 30, and the second inverter 40 may be disposed side by side along the particular horizontal direction Hs. Alternatively, the entirety of the smoothing capacitor 36, the first inverter 30, and the second inverter 40 may be disposed side by side along the vertical direction V. Alternatively, the smoothing capacitor 36 and the second inverter 40 may be disposed side by side, and the second inverter 40 and the first inverter 30 may be disposed side by side.

(5) In the embodiment described above, the inverter device 3 is fixed to the first case portion 21 which accommodates the speed change mechanism TM etc. However, embodiments of the present disclosure are not limited thereto. For example, the inverter device 3 may be fixed to the second case portion 28 which accommodates the rotary electric machine MG etc. Alternatively, the inverter device 3 may be fixed to both the first case portion 21 and the second case portion 28.

(6) In the embodiment described above, both the inverter device 30 and the second inverter 40 are disposed in the control element accommodation chamber P. However, embodiments of the present disclosure are not limited thereto. For example, only the first inverter 30 may be disposed in the control element accommodation chamber P, and the second inverter 40 may be disposed in the drive element accommodation chamber Q together with the pump motor PM. In this case, the first wiring member 60 may be branched in the control element accommodation chamber P to be connected to each of the first inverter 30 and the second inverter 40, or may be branched in the drive element accommodation chamber Q.

(7) In the embodiment described above, the present disclosure is applied to a drive device for a one-motor parallel type hybrid vehicle. However, embodiments of the present disclosure are not limited thereto. For example, the present disclosure may also be applied to a drive device for a two-motor hybrid vehicle that includes two rotary electric machines. In addition, the present disclosure may also be applied to a drive device for an electric vehicle that includes only the rotary electric machine MG, without including the internal combustion engine E, as the drive force source for the wheels W.

(8) Also regarding other configurations, the embodiments disclosed herein are illustrative in all respects, and it should be understood that the scope of the present disclosure is not limited thereto. It would be easy for a person skilled in the art to understand that the present disclosure may be altered as appropriate without departing from the scope and spirit of the present disclosure. Thus, it is a matter of course that other embodiments obtained by altering the present disclosure without departing from the scope and spirit of the present disclosure are also included in the scope of the present disclosure.

INDUSTRIAL APPLICABILITY

The present disclosure may be applied to a drive device for a hybrid vehicle.

The invention claimed is:

1. A vehicle drive device comprising:
a rotary electric machine that serves as a drive force source for wheels;
a speed change mechanism;
a pump motor that serves as a drive force source for an electric pump that generates a hydraulic pressure to be supplied to a servo mechanism for the speed change mechanism;
a case; and
a first inverter that controls the rotary electric machine and a second inverter that controls the pump motor, the first inverter and the second inverter being connected to a common DC power source, wherein:
the case includes a first case portion that accommodates the speed change mechanism, the electric pump and the pump motor, and a second case portion that accommodates the rotary electric machine, the first case portion and the second case portion being formed to be split along a plane that is perpendicular to an axial direction of the rotary electric machine;
a control element accommodation chamber is formed along an outer peripheral wall of the first case portion;
the first inverter and the second inverter are accommodated in the control element accommodation chamber;
a first wiring member that extends from the DC power source is branched in the control element accommodation chamber to be connected to each of the first inverter and the second inverter; and
the first inverter is connected to the rotary electric machine in the case by a second wiring member, and the second inverter is connected to the pump motor in the case by a third wiring member.

2. The vehicle drive device according to claim 1, wherein:
the rotary electric machine and the pump motor are accommodated in a drive element accommodation chamber formed in the case in an oil-tight manner;
the drive element accommodation chamber and the control element accommodation chamber communicate with each other via a communication hole; and
both the second wiring member that connects between the first inverter and the rotary electric machine and the third wiring member that connects between the second inverter and the pump motor pass through the communication hole.

3. The vehicle drive device according to claim 2, wherein:
the second wiring member includes a relay terminal disposed in the communication hole and a plurality of bus bars that connect between the first inverter and the relay terminal; and
the plurality of bus bars and a substrate that constitutes the second inverter are integrally held by a holding member.

4. The vehicle drive device according to claim 3, wherein in a vehicle mounted state, the communication hole is disposed above a surface of oil in the drive element accommodation chamber.

5. The vehicle drive device according to claim 4, further comprising:
a smoothing capacitor connected between the DC power source and the first inverter and the second inverter to smooth DC power to be supplied to both the first inverter and the second inverter, wherein
the smoothing capacitor and the first inverter are disposed side by side, and the first inverter and the second inverter are disposed side by side.

6. The vehicle drive device according to claim 3, further comprising:
a smoothing capacitor connected between the DC power source and the first inverter and the second inverter to smooth DC power to be supplied to both the first inverter and the second inverter, wherein
the smoothing capacitor and the first inverter are disposed side by side, and the first inverter and the second inverter are disposed side by side.

7. The vehicle drive device according to claim 2, wherein in a vehicle mounted state, the communication hole is disposed above a surface of oil in the drive element accommodation chamber.

8. The vehicle drive device according to claim 7, further comprising:
a smoothing capacitor connected between the DC power source and the first inverter and the second inverter to smooth DC power to be supplied to both the first inverter and the second inverter, wherein
the smoothing capacitor and the first inverter are disposed side by side, and the first inverter and the second inverter are disposed side by side.

9. The vehicle drive device according to claim 2, further comprising:
a smoothing capacitor connected between the DC power source and the first inverter and the second inverter to smooth DC power to be supplied to both the first inverter and the second inverter, wherein
the smoothing capacitor and the first inverter are disposed side by side, and the first inverter and the second inverter are disposed side by side.

10. The vehicle drive device according to claim 1, further comprising:
a smoothing capacitor connected between the DC power source and the first inverter and the second inverter to smooth DC power to be supplied to both the first inverter and the second inverter, wherein
the smoothing capacitor and the first inverter are disposed side by side, and the first inverter and the second inverter are disposed side by side.

* * * * *